United States Patent [19]
Krentz et al.

[11] Patent Number: 5,371,706
[45] Date of Patent: Dec. 6, 1994

[54] CIRCUIT AND METHOD FOR SENSING DEPLETION OF MEMORY CELLS

[75] Inventors: Steven V. Krentz, Houston; David A. Tatman, Plano, both of Tex.

[73] Assignee: Texas Instruments Incorporated, Dallas, Tex.

[21] Appl. No.: 932,462

[22] Filed: Aug. 20, 1992

[51] Int. Cl.$^5$ ............................................. G11C 7/00
[52] U.S. Cl. ................................. 365/201; 365/900; 365/185; 365/189.07; 365/210
[58] Field of Search ............... 365/201, 185, 182, 184, 365/208, 210, 900, 189.07

[56] References Cited

U.S. PATENT DOCUMENTS

| | | | |
|---|---|---|---|
| 5,043,940 | 8/1991 | Harari | 365/185 |
| 5,056,063 | 10/1991 | Santin et al. | 365/208 |
| 5,293,333 | 3/1994 | Hashimoto | 365/189.09 |
| 5,299,166 | 3/1994 | Suh et al. | 365/218 |

*Primary Examiner*—Eugene R. LaRoche
*Assistant Examiner*—Huan Hoang
*Attorney, Agent, or Firm*—Theodore D. Lindgren; Leo N. Heiting; Richard L. Donaldson

[57] ABSTRACT

The circuit and method of this invention provide for rapid and reliable detection of depleted or nearly-depleted cells in a column. The circuit is formed on the substrate of a nonvolatile, integrated-circuit memory including rows and columns of memory cells. The drain of each memory cell is connected to a drain-column line and the control gate that is connected to a wordline. One input of a sense amplifier is connected to the drain-column line. The other input of the sense amplifier is connected to a current reference formed on said substrate. The wordline is connected to a wordline test voltage and the output of the sense amplifier is coupled to an output pin of the integrated circuit. The current through the drain-column line is compared with the current through the current reference and, if the current through the drain-column line is sufficiently close to the current through said current reference, a signal is transmitted to an output pin of the integrated circuit.

9 Claims, 3 Drawing Sheets

CIRCUIT AND METHOD FOR SENSING DEPLETION OF MEMORY CELLS

NOTICE

Copyright © 1992 Texas Instruments Incorporated. A portion of this patent document contains material that is subject to copyright protection. Texas Instruments Incorporated has no objection to the facsimile reproduction of the issued patent or of those documents in the Patent and Trademark Office file pertaining to the issued patent. All other copyright rights are reserved.

BACKGROUND OF THE INVENTION

The present invention relates to a nonvolatile, integrated-circuit memory array such as an electrically-erasable, electrically-programmable read-only-memory (EEPROM) array and, more particularly, to prevention of over-erasure in a flash-type EEPROM array.

EEPROMs employing single-transistor memory cells, using hot-carrier injection for programming and Fowler-Nordheim tunnelling for erasure are described in: (a) "A Single Transistor EEPROM cell and its implementation in a 512K CMOS EEPROM," S. Mukherjee et al., IEDM 1985 (p. 616–619) and in (b) "A 90ns 100K Erase/Program Cycle Megabit Flash Memory," V. Kynett et al., ISSCC 1989 (p. 140–141). The topic of reference (a) is also discussed in U.S. Pat. No. 4,698,787.

In particular, the invention relates to predicting and minimizing read errors resulting from over-erasing the floating-gates of nonvolatile memory arrays. An EEPROM cell is over-erased when an excessive number of electrons is removed from its floating gate during an erasing operation. The source-drain path of an over-erased EEPROM cell is conductive with the control gate and the source or drain at the same electric potential.

Nonvolatile memory arrays include floating-gate memory cells arranged in rows and columns. The floating gate of a programmed memory cell is charged with electrons, and the electrons in turn render the source-drain path (channel) under the charged floating gate nonconductive when a chosen wordline select voltage is applied to the control gate. The nonconductive state is read as a "zero" bit. The floating gate of a non-programmed cell is positively charged, is neutrally charged, or is slightly negatively charged, such that the source-drain path under the non-programmed floating gate is conductive when the same chosen wordline select voltage is applied to the control gate. The conductive state is read as a "one" bit.

Each column and row of an EEPROM array may contain thousands of cells. The sources of each cell in a row are, for example, connected to a source line and each source line is connected to a common source-column line. The drains of each cell in a column are connected to a separate bitline (drain-column line). The control gates of each cell in a row are connected to a wordline. Prior to the first programming operation, or perhaps after erasure by ultraviolet light, the source-drain paths of the cells begin to conduct at a uniform control-gate threshold voltage Vt because the floating gates are neutrally charged (having neither an excess of electrons nor a deficiency of electrons). The initial uniform threshold voltage Vt may be, for example, +2.5 V between control gate and source. Adjustment of the initial uniform threshold voltage Vt may be made by altering the doping of the channel regions of the cells during manufacture.

After programming, the source-drain paths of the programmed cells have control-gate threshold voltages Vt distributed over a range of perhaps between +6 V to +9 V, for example. The distribution of threshold voltages Vt among individual cells is caused by processing variations, including variations in the tunnel oxide thicknesses, the areas of tunnelling regions and in the coupling ratios of the control-gate voltages to the floating gates, as well as variations in the programming voltages applied to individual cells.

After electrical erasure of the cells, the threshold voltages Vt of the erased cells may, for example, be distributed over a range from perhaps +0.5 V to +2.5 V with the majority of the cells having erased threshold voltages Vt near +1.5 V, the range depending on the localized variations in the tunnel oxide thickness, the areas of tunnelling regions, the capacitive coupling ratios between wordlines and floating gates, and the strengths of the erasing pulses. Using lower-strength erasing pulses, the range may be from perhaps +1.5 V to +3.5 V with the majority of the cells having erased threshold voltages Vt near +2.5 V. With higher-strength erasing pulses applied, the distribution may range from perhaps −0.5 V to +1.5 V with the majority of cells having erased threshold voltages Vt near +0.5 V. Cells with erased threshold voltages Vt less than that set during the manufacturing process have deficiencies of electrons (or have net positive charges) on the floating gates. The excess of positive charges on the floating gates causes the channel regions under such gates to be enhanced with electrons. Cells with negative threshold voltages are called "over-erased" cells.

In general, the extent of channel doping, the programming pulse strength, the erasing pulse strength and other factors are chosen such that the source-drain path of a cell will either be conductive or non-conductive when applying a chosen wordline select voltage to the control gate. The select voltage must have a value somewhere between the highest erased-threshold-voltage value of erased cells and the lowest programmed-threshold-voltage value of the programmed cells. In many types of memory arrays, the channel doping, programming/erasing voltages and other factors are chosen such that the wordline select voltage is equal to the available chip supply voltage Vcc, which may be +5 V. With +5 V applied to the control gates, the source-drain paths of all of the properly erased cells are conductive only if those cells have threshold voltages Vt below the +5 V select voltage. Similarly, the source-drain paths of all of the properly programmed cells are non-conductive only if those cells have threshold voltages Vt greater than the +5 V select voltage.

A common failure mechanism in flash EPROM technology is caused by over-erasure of cells. One of the problems associated with EEPROMs of the single-transistor, non-split-gate type is the difficulty of reading memory arrays after some of the cells have been over-erased, becoming depletion-mode devices. Because the channel regions of the over-erased cells are connected in parallel with all of the source-drain paths of other cells in a column, inaccuracies during reading operation may occur where the stored data in those columns is short-circuited by the over-erased cells. At least some of the over-erased cells may be conductive because the excessive positive charge on the floating gates causes the channel regions to invert from P-type to N-type.

Therefore, the over-erased cells conduct current even with their control gates grounded. If the depletion of one of the over-erased cells is severe, the leakage current through that cell will cause every cell, including programmed cells, in the same column to appear erased (conducting current when positive voltage is applied to the control gate). In many cases, the over-erased cells hinder programming operations.

One method for eliminating the problem of over-erasure is to construct cells with pass gates, or split gates, in which the channel between source and drain includes two series sections, one section having the control gate separated from the channel region by the gate dielectric, the second region having the floating gate separated from the channel region by the gate dielectric. However, such memory cells require more area on a silicon chip than do cells without split gates. Other methods include use of negative voltages, use of doping techniques, and application of low-energy programming pulses.

The problem of over-erasure may also be lessened checking after each flash erasing operation to see whether or not any of the cells are close to over-erasure. The check may be performed with a small positive voltage on the control gates of the cells. Circuits and methods for such checking are described in U.S. Pat. No. 4,460,982 issued Jul. 17, 1984; U.S. Pat. No. 4,841,482 issued Jun. 20, 1989; U.S. Pat. No. 4,860,261 issued Aug. 22, 1989; U.S. Pat. No. 4,875,188 issued Oct. 17, 1989; and U.S. Pat. No. 5,053,990 issued Oct. 1, 1991. Prior-art circuits and methods used to sense susceptibility to over-erasure are described later herein. The prior-art circuits and methods have required comparison circuits using off-chip current references. Because of the capacitance of such external testing circuitry, the process of testing memories to determine depletion or near depletion of cells is slower than necessary. Prior-art memories have included reference columns used as current references during reading operations. However, use of such reference column produces an unreliable comparison current for use in depletion sensing.

Accordingly, there is a need for a circuit and method to provide for fast and reliable detection of depleted or nearly-depleted cells in a column. Preferably, the circuit and method would also permit the extent of depletion to be quantified easily and quickly.

SUMMARY OF THE INVENTION

The circuit and method of this invention provide for rapid and reliable detection of depleted or nearly-depleted cells in a column. The circuit and method also permit the likelihood of depletion to be determined in a rapid and reliable manner in comparison to previous circuits and methods.

The circuit and method of this invention use a sense amplifier with a stable current reference that conducts an optimal amount of current, instead of using a reference column or an external standard.

The circuit for sensing depletion of memory cells is formed on the substrate of a nonvolatile, integrated-circuit memory including rows and columns of memory cells. Each memory cell includes a drain that is connected to a drain-column line and includes a control gate that is connected to a wordline. A sense amplifier has first input connected to the drain-column line. A current reference formed on said substrate is connected, during sensing, between a second input to the sense amplifier and a reference voltage, such as ground. The wordline is connected to a wordline test voltage and the output of the sense amplifier is coupled to an output pin of the integrated circuit.

The method for sensing depletion of a memory cell in a column of such memory cells includes placing a test voltage on at least the control gate of that memory cell, then applying a first voltage to a drain-column line connected to the drain of each memory cell in the column. A second voltage is applied to a current reference formed on the substrate with the memory cells. The current through the drain-column line is compared with the current through the current reference and, if the current through the drain-column line is sufficiently close to the current through said current reference, a signal is transmitted to an output pin of the integrated circuit.

DETAILED DESCRIPTION OF THE INVENTION

Figure 1:
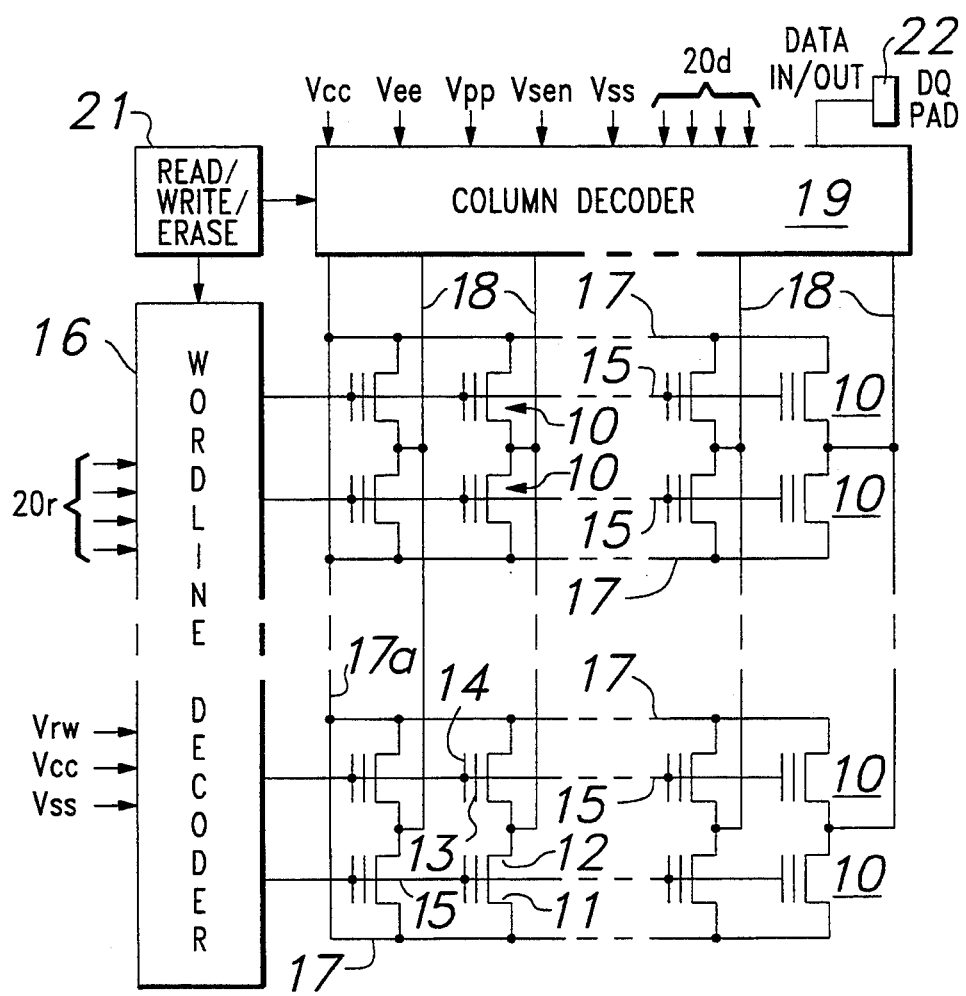
FIG. 1 is an electrical schematic diagram, in partial block form, of a memory cell array.

Referring to FIG. 1, an example array of memory cells, which is an integral part of a memory chip, is shown for the purpose of illustrating use of the circuit of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In a write or program mode, the wordline decoder 16 may function, in response to wordline address signals on lines 20r and to signals from Read/Write/Erase control circuit 21, (or microprocessor 21) to place a preselected first programming voltage Vrw (approx. +12 V) on a selected wordline 15, including a selected control-gate 14. Column decoder 19 also functions to place a second programming voltage Vpp (approx. +5 to +10 V) on a selected drain-column line 18 and, therefore, the drain 12 of selected cell 10. Source lines 17 are connected to reference potential Vss, which may be ground. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region. For memory cells 10 fabricated in accordance with the preferred embodiment, the coupling coefficient between a control gate 14/wordline 15 and a floating gate 13 is approximately 0.6. Therefore, a programming voltage Vrw of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0v) source line 17 is insufficient to cause a Fowler-Nordheim tunnelling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash-erase mode, the column decoder 19 may function to leave all drain-column lines 18 floating. The wordline decoder 16 functions to connect all the wordlines 15 to reference potential Vss, which may be ground. The column decoder 19 also functions to apply a high positive voltage Vee (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is 0 V, the cell 10 remains in the nonconducting state during erase. For that reason, and also by reason of the fact that the drain is floated, no channel-hot carriers are generated.

In the read mode, the wordline decoder 16 functions, in response to wordline address signals on lines 20r and to signals from Read/Write/Erase control circuit 21, to apply a preselected positive voltage Vcc (approx. +5 V) to the selected wordline 15, and to apply a low voltage (ground or Vss) to deselected wordlines 15. The column decoder 19 functions to apply a preselected positive voltage Vsen (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal or DQ PAD 22. The conductive or nonconductive state of the cell 10 connected to the selected drain-column line 18 and the selected wordline 15 is detected by a sense amplifier (not shown) connected to the DATA IN/OUT terminal or DQ PAD 22.

As is well-known, the source and drain diffusions of nonvolatile memories are similar, often identical. Therefore, a particular type of diffusion may be used as a source for one operation and a drain for another operation. Accordingly, the terms "source" and "drain" as used herein are, by definition, interchangeable.

For convenience, a table of read, write and erase voltages is given in TABLE I below:

TABLE I

| | Read | Write | Flash Erase |
| --- | --- | --- | --- |
| Selected Wordline | 5 V | 12 V | 0 V (All) |
| Deselected Wordlines | 0 V | 0 V | — |

TABLE I-continued

| | Read | Write | Flash Erase |
| --- | --- | --- | --- |
| Selected Drain Line | 1.0 V | 5–10 V | Float (All) |
| Deselected Drain Lines | 0 V/Float | 0 V/Float | — |
| Source Lines | 0 V | About 0 V | 10–15 V (All) |

Figure 2:
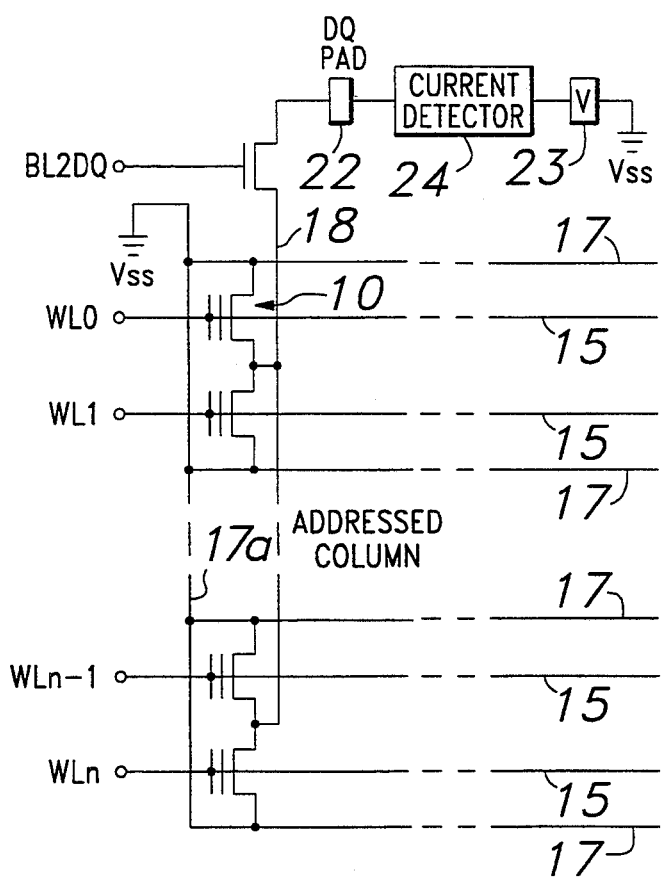
FIG. 2 is a prior-art circuit that uses an external standard for detecting depleted or nearly-depleted cells in a column.

Referring to FIG. 2, a prior-art circuit for detecting depleted or nearly-depleted cells 10 in a column is illustrated. In the circuit of FIG. 2, all the wordlines 15 in the array are held to a user-supplied level, usually reference voltage Vss or a small positive voltage. When the enabling signal BL2DQ is asserted (made positive), a conduction path is formed between the addressed drain-column line 18 and the output pin or DQ PAD 22. The depletion level of the column of cells 10 is detected by a voltage supply 23 (V) on the DQ PAD 22 through a current detector 24 (an ammeter or a current-viewing resistor or any circuit that will read or detect current). Using the circuit of FIG. 2, the current drawn by drain-column line 18 of a column of cells 10 is measured as a wordline 15 voltage is applied to each cell 10 in the column. By carefully selecting the applied wordline 15 voltage and the magnitude of current for negative test result, the circuit of FIG. 2 is used to detect depletion before the depletion is manifested as a read or program failure, thereby characterizing susceptibility to depletion and detecting the existence of fast-erasing cells.

The aforementioned FIG. 2 circuit requires more elaborate external hardware than is necessary for the detection of depleted or nearly-depleted cells 10 in a column. In addition, use of the external testing circuitry 23,24 causes the current sensing to be very slow.

Figure 3:
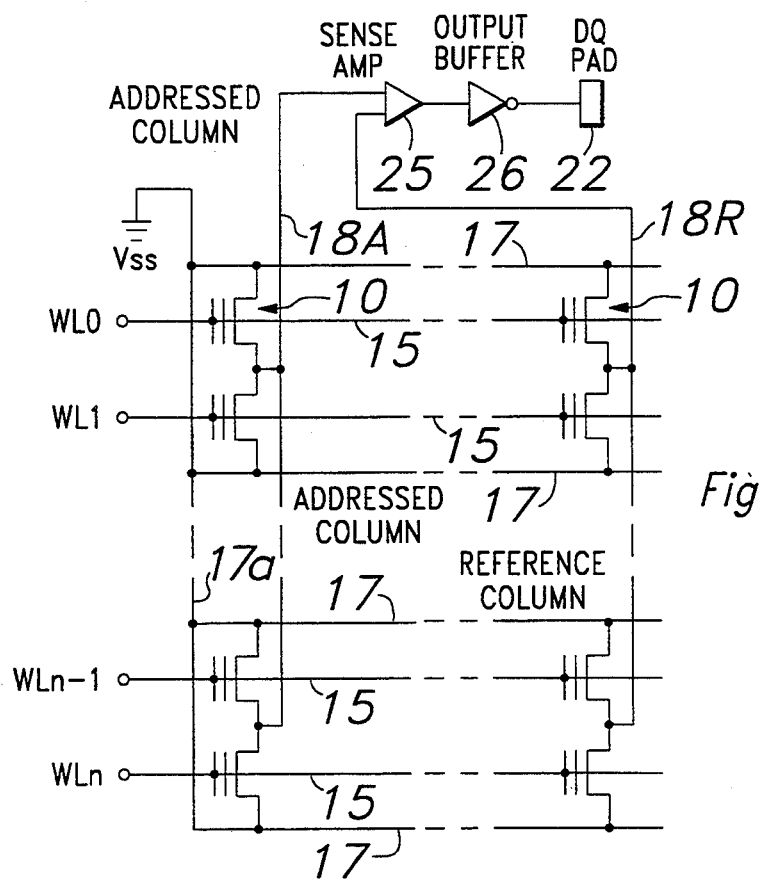
FIG. 3 is a prior-art circuit using a reference-column standard for reading data in a column.

Referring now to FIG. 3, another prior-art circuit is illustrated. A sense amplifier 25 (SENSE AMP) is used in read mode to apply a voltage to both the addressed drain-column line 18A and the reference drain-column line 18R of cells 10. The sense amplifier 25 then compares the current of the two drain-column lines 18A,18R of cells 10 to determine whether or not a cell 10 in the addressed column is programmed, the particular cell 10 having read voltage Vcc applied to its wordline 15 and control gate 14. The output of sense amplifier 25 is coupled to the DQ pad 22 by an output buffer 26.

During normal read operations, current in the addressed column of cells 10 is measured against that of a reference column of cells 10 with the same wordline 15 voltages as in the main array. However, a reference column of cells 10 is not helpful when measuring leakage current with all wordlines 15 at a low voltage. This is for two reasons:

(1) In most cases, depletion data is required at wordline 15 voltages below the reference cell threshold voltages (Vt's). At such low voltages, however, the reference column of cells 10 conducts zero current. This makes the test hyper-sensitive. In fact, even if the addressed column of cells 10 has no low-threshold-voltage cells, the output is indeterminable or, at best, very sensitive to noise.

(2) When the wordline 15 voltage is greater than that of threshold voltage Vt of the applicable reference cell 10, the reference column of cells 10 conducts sufficient current that the test is rendered insensitive.

Figure 4:
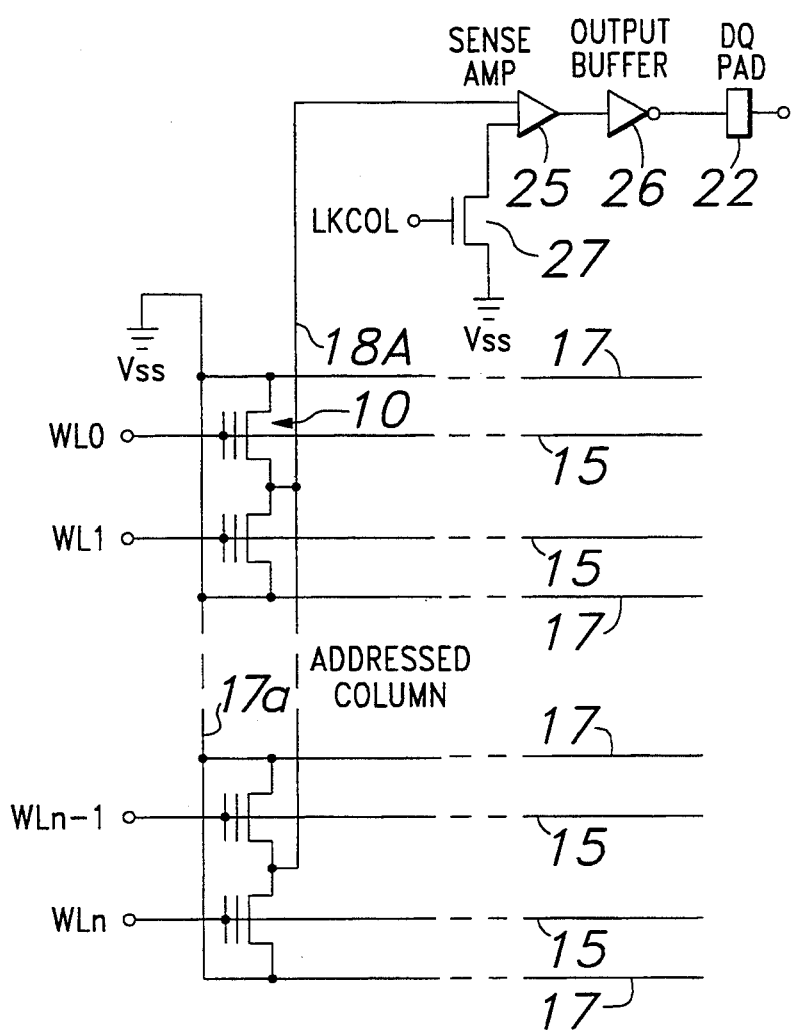
FIG. 4 illustrates the circuit of this invention, which uses an internal standard for detecting depleted or nearly-depleted cells in a column.

In the preferred embodiment, leakage current is measured internally via the sense amplifier 25 used in normal read mode operations (FIG. 3). Referring now to FIG. 4, the circuit of this invention is illustrated. Current reference 27 is shown as a N-channel transistor. Current reference 27 may take any one of several forms. However, a N-channel transistor is one of the simplest current references 27 to construct.

As in the prior art, a predetermined voltage is applied to all of the wordlines 15. The predetermined voltage may be a small positive voltage or reference voltage. In the circuit of FIG. 4, the N-channel transistor used as current reference 27 is controlled by enabling signal LKCOL. The current through current reference 27 is compared with the current of the addressed column of cells 10 by the sense amplifier 25 that is coupled to DQ pad 22 by an output buffer 26. In an example embodiment with over one million memory cells, the current through current reference 27 is approximately fifteen microamperes.

The length and width of the reference transistor used as current reference 27 are formed to draw a predetermined reference current in response to a voltage applied by the sense amplifier 25. Thus, the circuit of FIG. 4 will output a "1" to the DQ PAD 22 when the current in the addressed column of cells 10 is greater than a predetermined current. For example, the sense amplifier 25 is adjusted to detect a "1" when the addressed column of cells 10 conducts one-third of the current of the current reference 27.

The circuit of FIG. 4 provides a rapid and reliable way to detect and quantify the degree of depletion. With reference voltage or a small positive voltage applied to the wordline 15 voltage input, the result is read out at the DQ PAD 22, as in the normal read mode.

The circuit of FIG. 4 is also capable of use with varying wordline 15 voltage to obtain distribution data such as the values of wordline 15 voltage at which each column of cells 10 trips the sense amplifier 25.

In addition, the circuit of FIG. 4 requires no unusual fabrication problems, and the speed of the test is greatly improved.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method for sensing depletion of a memory cell in a column of such memory cells in a nonvolatile memory, said method comprising:

placing a test voltage on the control gate of said memory cell in said column;

applying a first voltage to a drain-column line connected to the drain of each memory cell in said column;

applying a second voltage to a current reference formed on the substrate with said memory cells;

comparing the current through said drain-column line with the current through said current reference; and if said current through said drain-column line is sufficiently close to said current through said current reference, transmitting a signal to an output pin.

2. The method of claim 1, wherein said first and second voltages are approximately equal.

3. The method of claim 1, wherein said test voltage is a small positive voltage.

4. The method of claim 1, including applying a reference voltage to the source of said memory cell.

5. The method of claim 1, wherein said current reference is the source-drain path of a transistor.

6. The method of claim 1, wherein said current reference is a transistor with a source-drain path and wherein the ratio of the length to the width of said source-drain path is used to determine the resistance of said current reference.

7. The method of claim 1, wherein said current reference is a transistor with a source-drain path and a gate, and wherein said gate connected to a test enable signal.

8. The method of claim 1, wherein said circuit is used to sense depletion of said memory cell after an erase cycle.

9. The method of claim 1, wherein said first voltage and said second voltage are applied by a sense amplifier.

* * * * *